(12) United States Patent
Yeh et al.

(10) Patent No.: US 6,657,894 B2
(45) Date of Patent: Dec. 2, 2003

(54) APPARATUS AND METHOD FOR PROGRAMMING VIRTUAL GROUND NONVOLATILE MEMORY CELL ARRAY WITHOUT DISTURBING ADJACENT CELLS

(75) Inventors: Chih-Chieh Yeh, Taipei (TW); Wen-Jer Tsai, Hualien (TW); Tao-Cheng Lu, Kaohsiung (TW)

(73) Assignee: Macronix International Co., Ltd,, Hsinchu (TW)

( * ) Notice: Subject to any disclaimer, the term of this patent is extended or adjusted under 35 U.S.C. 154(b) by 0 days.

(21) Appl. No.: 10/112,923

(22) Filed: Mar. 29, 2002

(65) Prior Publication Data

US 2003/0185051 A1 Oct. 2, 2003

(51) Int. Cl.[7] ............................................... G11C 16/04
(52) U.S. Cl. ........................... 365/185.16; 365/185.29; 365/185.18
(58) Field of Search ....................... 365/185.16, 185.29, 365/185.18

(56) References Cited

U.S. PATENT DOCUMENTS

| | | | |
|---|---|---|---|
| 3,916,169 A | | 10/1975 | Cochran et al. |
| 3,934,233 A | | 1/1976 | Fisher et al. |
| 4,021,781 A | | 5/1977 | Caudel |
| 4,387,447 A | | 6/1983 | Klaas et al. |
| 5,898,606 A | * | 4/1999 | Kobayashi et al. .... 365/185.17 |
| 5,940,325 A | * | 8/1999 | Chang et al. .......... 365/185.29 |
| 5,959,892 A | | 9/1999 | Lin et al. |
| 6,175,519 B1 | | 1/2001 | Lu et al. |
| 6,195,287 B1 | | 2/2001 | Hirano |
| 6,201,737 B1 | | 3/2001 | Hollmer et al. |
| 6,477,083 B1 | * | 11/2002 | Fastow et al. ......... 365/185.16 |

* cited by examiner

Primary Examiner—Huan Hoang
(74) Attorney, Agent, or Firm—Baker & McKenzie

(57) ABSTRACT

A virtual ground nonvolatile memory cell array is formed by a plurality of adjacent nonvolatile memory cells arranged in rows and columns so as to form an array. Each of the nonvolatile memory cells is formed by an N channel MOSFET with a trapping layer formed between two isolating layers. In the erase state, the trapping layer stores an amount of electrons. A method for programming the virtual ground nonvolatile memory cell array is also disclosed. The potentials applied to the bitlines and wordlines in the array are preset to program nonvolatile memory cells and not to disturb cells adjacent to the nonvolatile memory cell to be programmed.

9 Claims, 10 Drawing Sheets

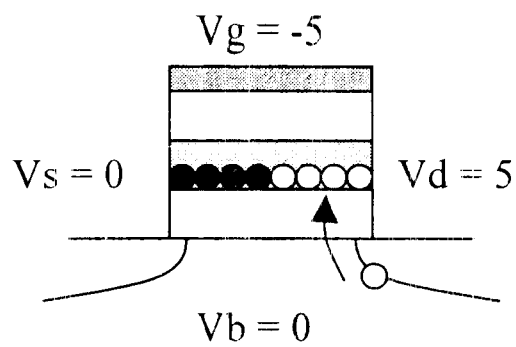
Fig. 8A: condition of Cell A
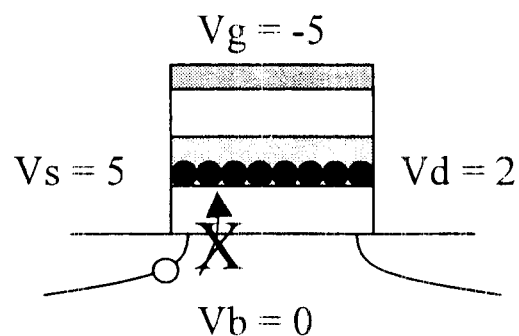
Fig. 8B: condition of Cell B
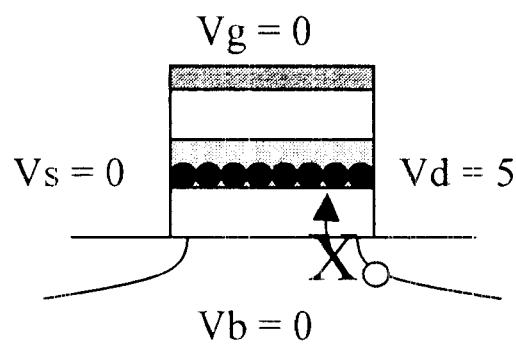
Fig. 8C: condition of Cell C 0# APPARATUS AND METHOD FOR PROGRAMMING VIRTUAL GROUND NONVOLATILE MEMORY CELL ARRAY WITHOUT DISTURBING ADJACENT CELLS

BACKGROUND OF THE INVENTION

1. Field of the Invention

The present invention relates to semiconductor memory devices, and more particularly, to a method and an apparatus for programming a virtual ground nonvolatile memory cell array without disturbing adjacent cells.

2. Description of the Related Art

FIG. 3 is a block diagram that illustrates the structure of a prior art nonvolatile memory cell where a nonvolatile memory cell 70 includes an N-channel MOSFET structure. The nonvolatile memory cell 70 includes a P type substrate 706 with two buried N+ junctions, one being the source 700 and the other being the drain 701. A channel region 707 is formed between the source 700 and the drain 701. Above the channel is a first isolating layer 703, which generally is a silicon oxide layer. On top of the first isolating layer 703 is a trapping layer 704, which generally is a nitride layer. The trapping layer 704 forms the memory retention layer that traps the electrons as they are injected into the nitride layer. A second isolating layer 705, which generally is an oxide layer, is formed to overlay the silicon nitride layer. The silicon oxide layer 705 electrically isolates a conductive gate 702 formed over the second isolating layer 705. The two silicon oxide layers 703 and 705 function as isolation dielectric layers.

To program or write the nonvolatile memory cell 70, voltages are applied to the drain 701 and the gate 702 and the source 700 is grounded. These voltages generate a vertical and lateral electric field along the length of the channel from the source to the drain. This electric field causes electrons to be drawn off the source 700 and begin accelerating towards the drain. As they move along the length of the channel, they gain energy. If they gain enough energy they are able to jump over the potential barrier of the isolation layer 703 into the trapping layer 704 and become trapped. The probability of this occurring is at a maximum in the region of the gate next to the drain because it is near the drain where the electrons gain the most energy. The accelerated electrons are termed hot electrons and once injected into the nitride layer they become trapped and remain stored therein.

The continuing demand for higher speed and lower cost semiconductor memories has led to the development of the virtual ground memory design for programmable nonvolatile memories. A virtual ground memory design can increase array density while maintaining process compatibility with existing semiconductor processes.

While virtual ground memory designs enjoy advantages from increased bit density, they have a number of disadvantages. One disadvantage is the problem of unwanted interaction between adjacent memory cells. This interference can take the form of a program disturb condition, in which programming of a selected cell leads to unwanted programming of unselected adjacent memory cells. This interference can also take the form of read access degradation due to an unwanted current component. In both situations, the interference affects memory cells located in adjacent columns and connected to the selected row line. Interaction between adjacent cells also causes parasitic currents that interfere with reading, erasing and programming of individual cells. Ultimately, the access speed and integrity of the memory array is adversely affected by these problems.

To avoid the disturbance to adjacent cells, some isolation spaces are formed to isolate a plurality of connecting cells, as illustrated in FIGS. 1 and 2. However, these conventional designs are space-wasting and inefficient. Such designs will lead to a significant overall size increment in a semiconductor memory chip so as to prohibitively increase the occupied space and cost.

Thus, there is a general need in the art for an optimal programming mechanism for virtual ground nonvolatile memory arrays, and more particularly, for a programming that allows for programming of a selected memory cell without disturbing data stored on adjacent unselected memory cells.

SUMMARY OF THE INVENTION

The present invention advantageously provides a method and an apparatus for programming a selected cell within a virtual ground nonvolatile memory cell array without disturbing adjacent array cells.

A virtual ground nonvolatile memory cell array according to a preferred embodiment of the invention is formed by a plurality of adjacent nonvolatile memory cells arranged in rows and columns so as to form an array. The nonvolatile memory cells are formed by an N channel MOSFET where each cell includes a gate, a source, a drain and a channel between the source and the drain. A trapping layer is provided between two isolating layers. The trapping layer stores an amount of electrons in the erase state for the memory cells according to the invention.

The invention further provides a method for programming a selected memory cell that substantially avoids the disturbance of data stored in adjacent cells. As a part of electrically programmable semiconductor memory device, an array of nonvolatile memory cells arranged in rows and columns so as to form an array. The nonvolatile memory cell array according to a preferred embodiment of the invention includes a control gate, a first terminal and second terminal, the control gates of memory cells in a row being coupled to the same wordline. According to this particular embodiment, the method according to the invention comprises the steps of applying a first potential to a first bitline coupled to a source of the selected nonvolatile memory cell, applying a second potential to a second bitline coupled to a drain of the selected nonvolatile memory cell, and applying a third potential to a first wordline coupled to a gate of the selected memory cell.

To avoid disturbance between the memory cells in the array, the difference of the first potential and the third potential is sufficient to cause holes to be injected from the source of the selected nonvolatile memory cell to the gate of the selected nonvolatile memory cell. Moreover, the potential difference of the second potential and the third potential is sufficient to cause holes not to be injected from the drain of the selected nonvolatile memory cell to the gate of the selected nonvolatile memory cell. A bit is programmed to the trapping layer of the selected nonvolatile memory cell at a side near the source of the selected nonvolatile memory cell.

In addition, to avoid disturbance, a fourth potential can further be applied to a third bitline next to the second bitline. A potential difference of the second and fourth potentials will cause the holes not to be injected to a trapping layer of a nonvolatile memory cell coupled to the third bitline and next to the selected nonvolatile memory cell, where the first, second and fourth potentials are formed as a first potential set.

BRIEF DESCRIPTION OF THE DRAWINGS

The preferred and other embodiments of the invention are further described in detail below in conjunction with the accompanying drawings (not necessarily drawn to scale), in which:

FIGS. 8A, 8B and 8C are schematic cross-sectional views of three adjacent cells as one of the cells is being programmed according to a further embodiment of the invention.

DETAILED DESCRIPTION OF THE PREFERRED EMBODIMENTS

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
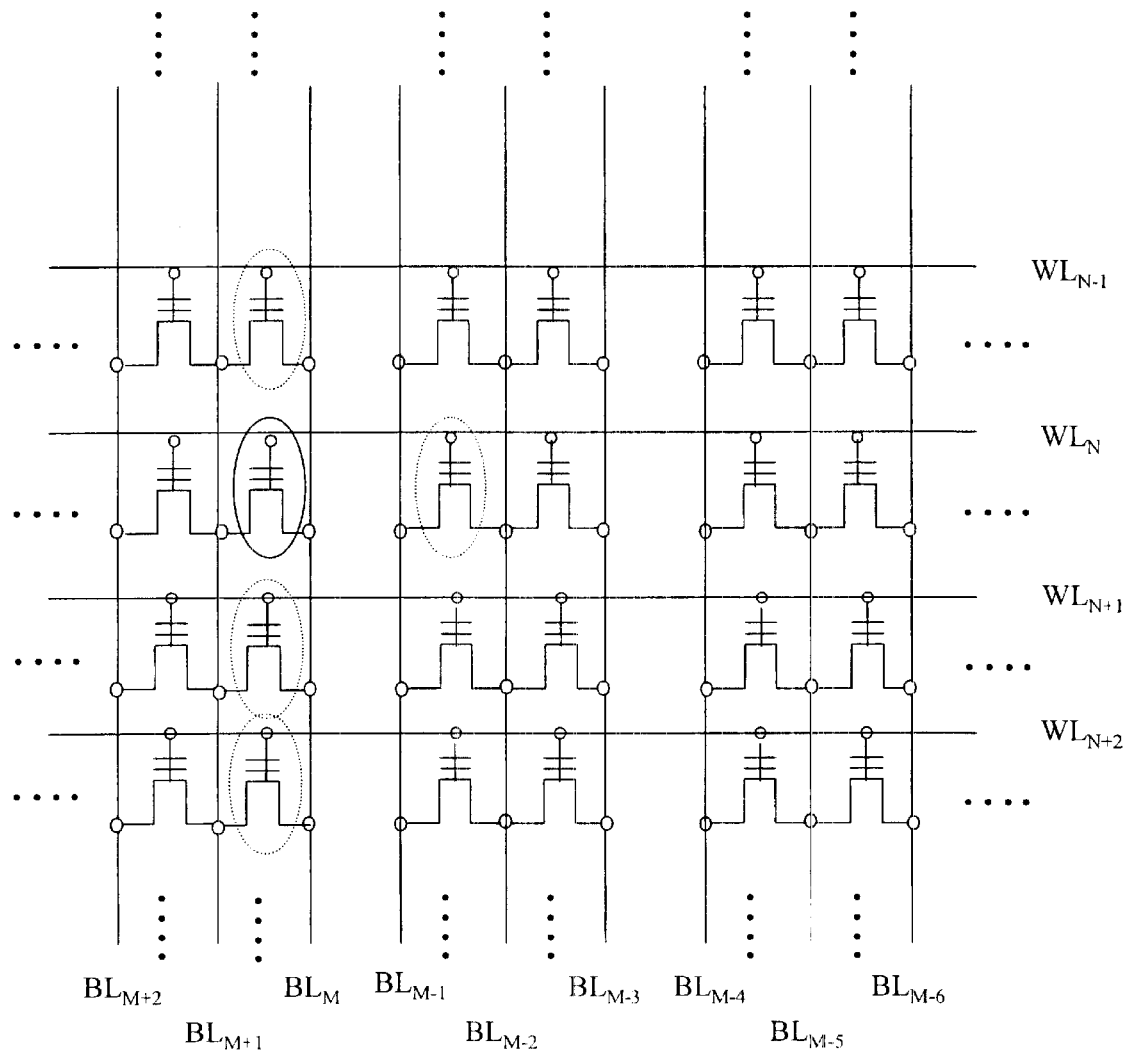
FIG. 1 is a circuit diagram illustrating the structure of an array of nonvolatile memory cells in the prior art.
Figure 2:
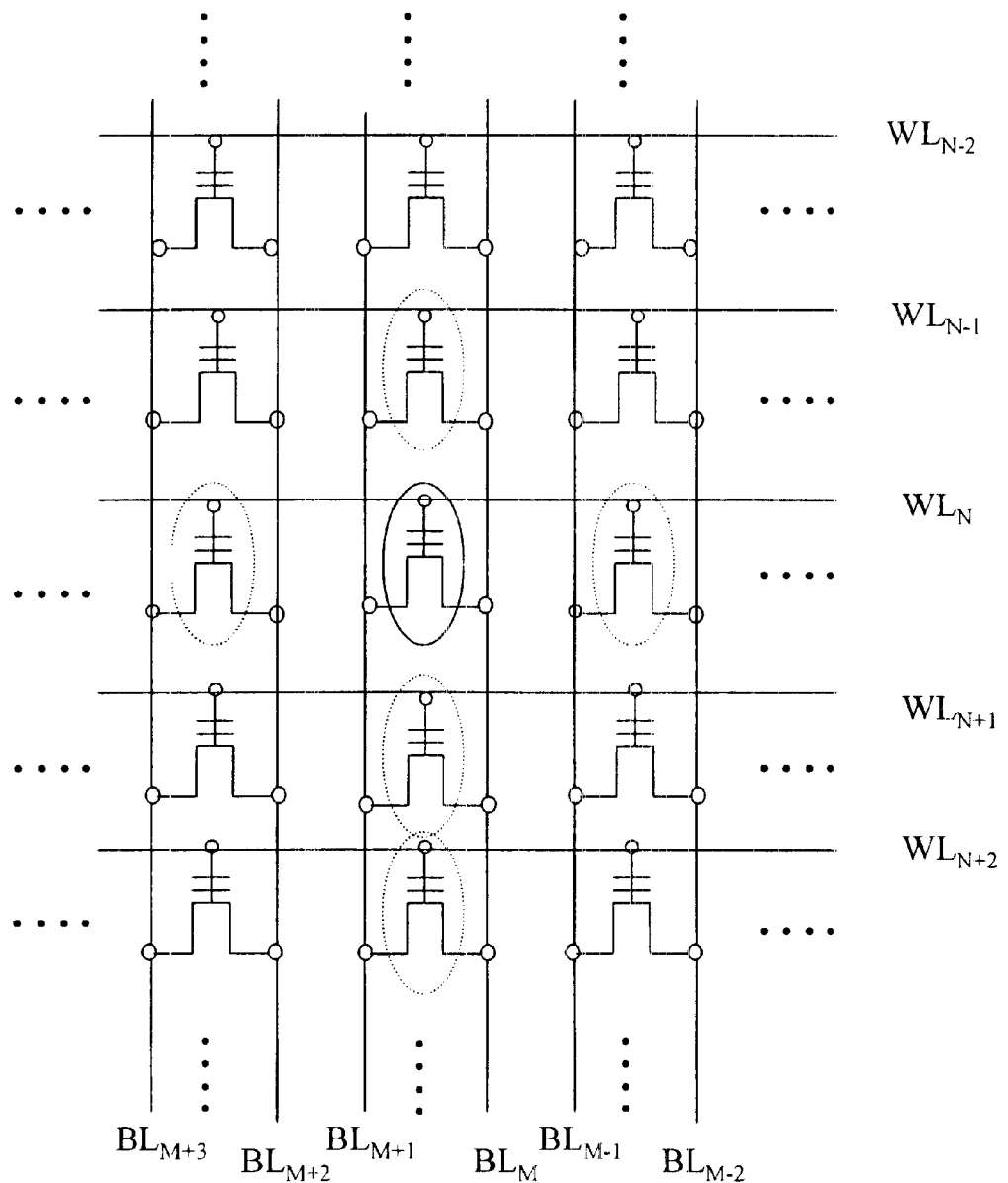
FIG. 2 is another circuit diagram illustrating the structure of an array of nonvolatile memory cells in the prior art.
Figure 3:
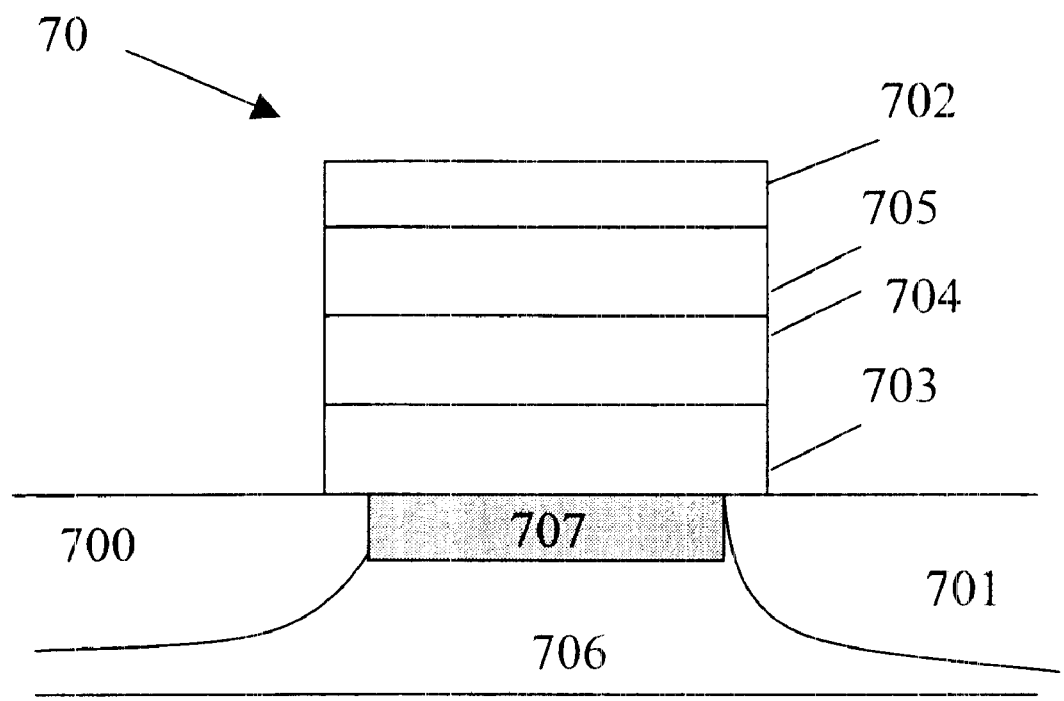
FIG. 3 is schematic view illustrating a nonvolatile memory cell in the prior art.
Figure 4:
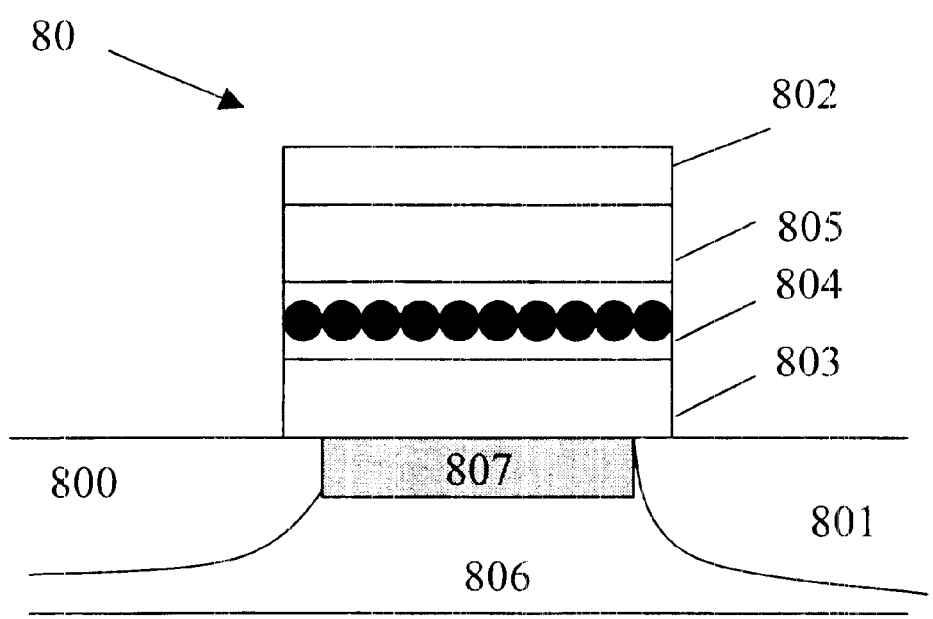
FIG. 4 is a schematic view illustrating a preferred embodiment of the nonvolatile memory cell according to the invention.

The nonvolatile memory cell 80 according to an embodiment of the invention is illustrated in FIG. 4. The nonvolatile memory cell 80 includes an N-channel MOSFET structure in general. In the nonvolatile memory cell 80, a P type substrate 806 includes two buried N+ junctions, one being the source 800 and the other being the drain 801. A channel region 807 is formed between the source 800 and the drain 801. Above the channel is a first isolating layer 803, which generally is a silicon oxide layer. On top of the first isolating layer 803 is a trapping layer 804, which generally is a nitride layer. The trapping layer 804 forms the memory retention layer for trapping the electrons as they are injected into the nitride layer. A second isolating layer 805, which generally is a silicon oxide layer, is formed to overlay the silicon nitride layer. The silicon oxide layer 805 functions to electrically isolate a conductive gate 802 formed over the second isolating layer 805. The two silicon oxide layers 803 and 805 function as isolation dielectric layers.

Numerous advantages of the invention lie in the manner in which the nonvolatile memory cell 80 is programmed, read and erased. In the erase state, electrons are stored in the nitride layer so that the energy level in the channel 807 is normally at a high state. In programming the nonvolatile memory cell 80, hot electric holes are injected into the trapping layer 804 from the source 800 or the drain 801 so as to change the energy barrier in the channel.

Figure 5A:
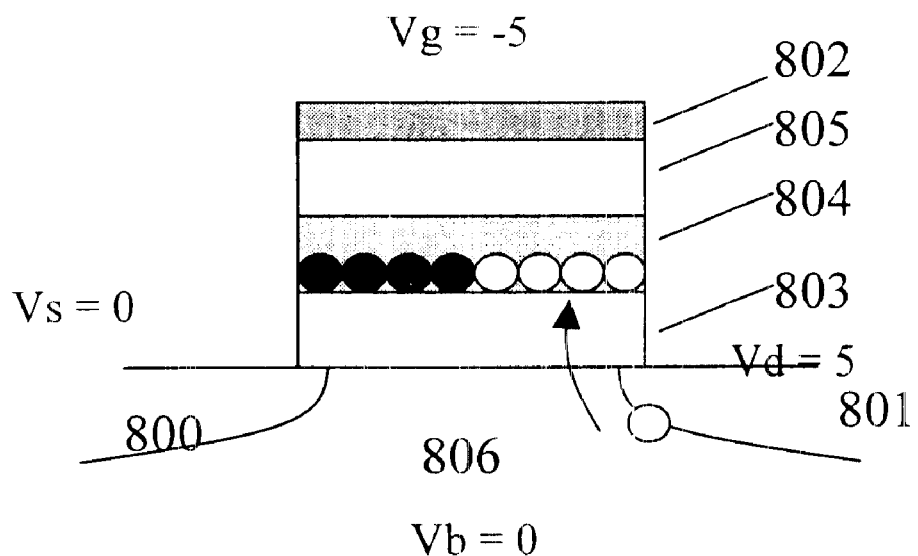
FIGS. 5A and 5B are schematic views respectively illustrating exemplary operations of programming the source bit and the drain bit of the nonvolatile memory cell according to an embodiment of the invention.
Figure 5B:
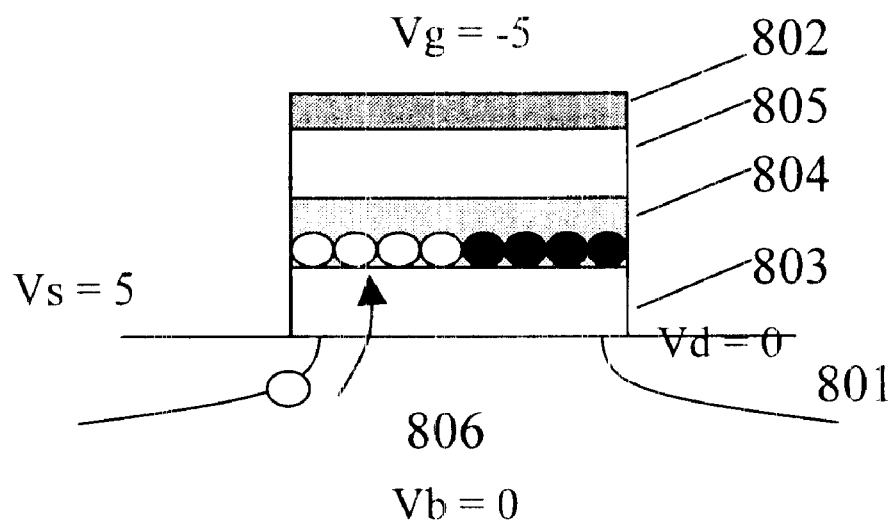

To program or write the nonvolatile memory cell in accordance with the invention, a voltage difference is formed between the drain 801 and the gate 80.2, where the source 800 is grounded. For example, as shown in FIG. 5A, a voltage of −5 volts (V) is applied to the gate 802 and 5 V is applied to the drain 801. These voltages generate a vertical and lateral electric field along the length of the channel from the drain 801 to the gate 802. This electric field causes the electric holes to be drawn off the drain 801 and to accelerate towards the source. The electric holes gain energy as they move along the length of the channel. When the electric holes gain sufficient energy, they are able to jump over the potential barrier of the silicon oxide layer 803 into the trapping layer 804 where they are trapped. The probability of this occurring is at a maximum in the region of the gate next to the drain 801 because it is near the drain where the holes gain the most energy. These accelerated holes are termed hot holes. Once the hot holes are injected into the nitride layer they become trapped and remain stored therein. The trapped holes cannot spread through the nitride layer because of the low conductivity of the nitride layer and the lateral electric field. Thus, the trapped charge remains in a localized trapping region typically located close to the drain. Moreover, FIG. 5B is a schematic view that illustrates an exemplary operation for programming the source bit according to the invention. The programming of the source bit is generally similar to the programming of the drain bit, except that the voltages applied to the source 800 and drain 801 is interchanged so as to generate a different effect.

Figure 6:
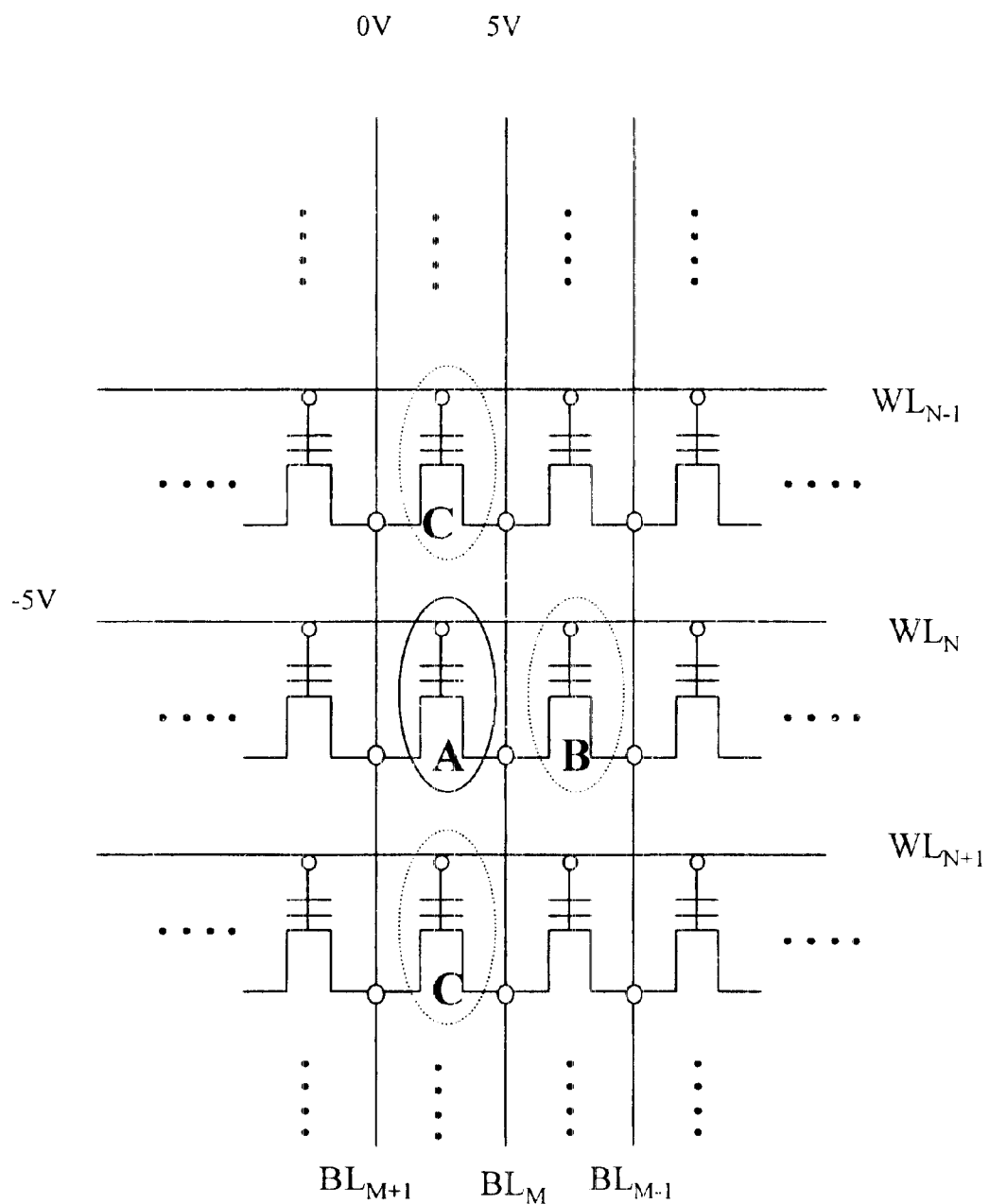
FIG. 6 is a circuit diagram generally illustrating the internal structure of an array of nonvolatile floating gate memory cell in accordance with an embodiment of the invention.
Figure 7:
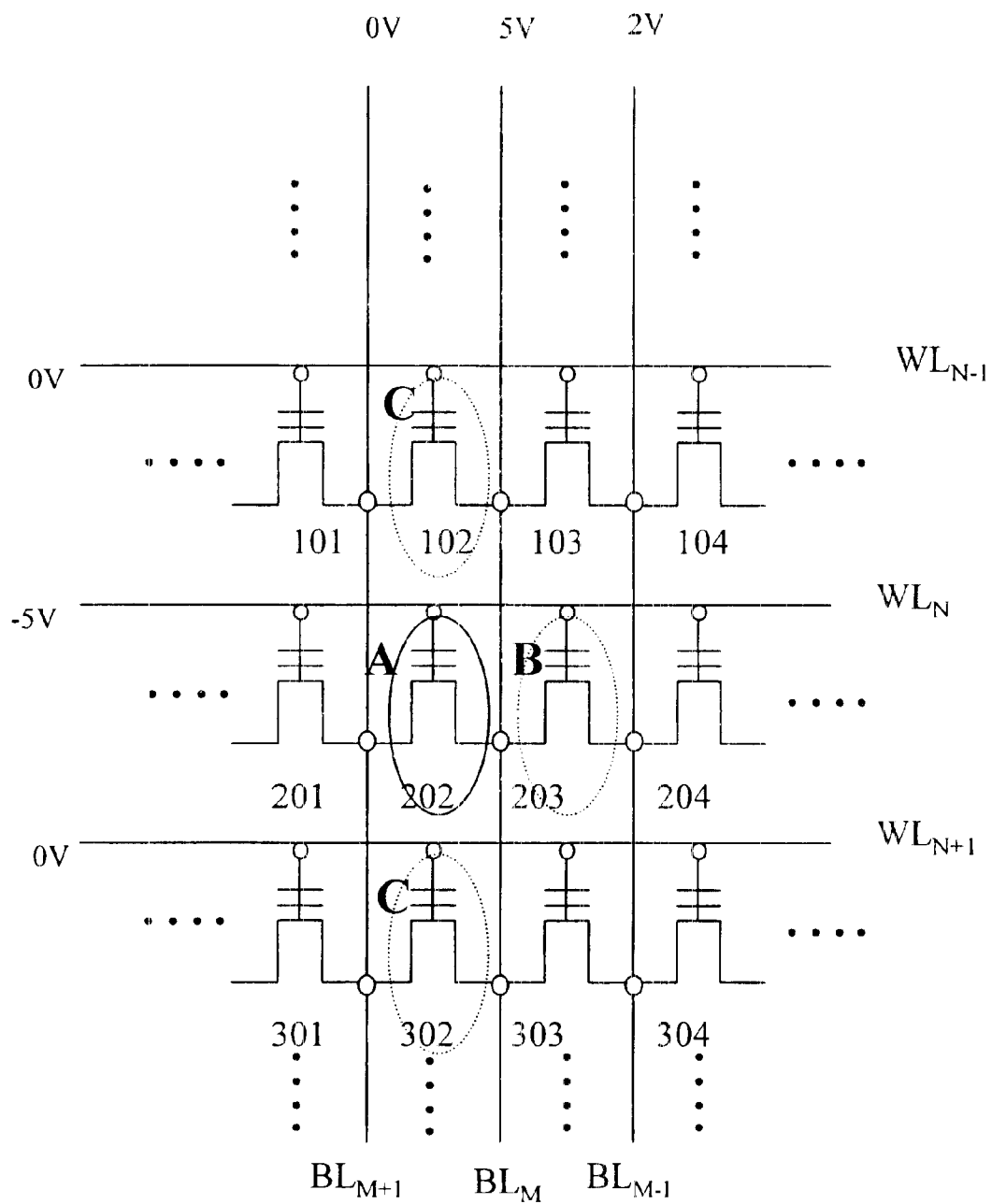
FIG. 7 is a circuit diagram illustrating how column lines of the array of floating gate memory cells are coupled together so as to reduce the disturbance of data stored on adjacent cells for programming a selected cell in accordance with a preferred embodiment of the present invention.

FIG. 6 is a circuit diagram that generally illustrates the internal structure of an array of nonvolatile memory cell in accordance with an embodiment of the invention. FIG. 7 is a circuit diagram that further illustrates how column lines of the array of nonvolatile memory cells are coupled together so as to reduce the disturbance of data stored on adjacent cells for programming a selected cell in accordance with a preferred embodiment of the present invention. The array according to the invention includes a plurality of nonvolatile memory cells including at least 101, 102, 103, 104, 201, 202, 203, 204, 301, 302, 303, and 304. The nonvolatile memory cells are coupled source-to-drain to form rows of nonvolatile memory cells. Control gates of the nonvolatile memory cells in a row are coupled to the same wordline. Nonvolatile memory cells 101, 102, 103, and 104 are coupled together source-to-drain into a row, where the control gates of these memory cells are coupled to wordline $WL_{N-1}$. Memory cells 201, 202, 203, and 204 are coupled together source-to-drain into a row, where the control gates of these memory cells are coupled to wordline $WL_N$. Memory cells 301, 302, 303, and 304 are coupled together source-to-drain into a row, and the control gates of these memory cells are coupled to wordline $WL_{N+1}$.

A number of column lines pass through the array of memory cells. These column lines are, in order from left to right, bit line $BL_{M+1}$, bit line $BL_M$, and bit line $BL_{M-1}$. These column lines can be selectively coupled to memory cells through a plurality of transistors controlled by block select signals. The drains of the nonvolatile memory cells 101, 201, and 301 are coupled together through the bit line $BL_{M+1}$. The drains of the nonvolatile memory cells 101, 201, and 301 and the sources of the nonvolatile memory cells 102, 202 and 302 are coupled together through the bit line $BL_{M+1}$. The drains of the nonvolatile memory cells 102, 202, and 302 and the sources of the nonvolatile memory cells 103, 203 and 303 are coupled together through the bit line $BL_M$. The drains of the nonvolatile memory cells 103, 203, and 303 and the sources of the nonvolatile memory cells 104, 204 and 304 are coupled together through the bit line $BL_{M-1}$.

A large number of nonvolatile memory cells (e.g., 512K cells) are formed as memory blocks as basic units for erasing the data in the memory cells. For flash memory devices, the data are erased in units of blocks where data can be deleted very quickly. The selection of the material for the trapping layer must be that it can store data in a sustaining fashion. That is, the electricity of the trapping layer can be retained even when the power is turned off. In general, nitride or polysilicon materials have such advantageous properties for being the trapping layer in accordance with the invention. In the virtual ground array according to a preferred embodiment of the invention, the erase operation is that the memory cells are all erased to high states.

Referring to FIG. 7, the cells 102 and 302 are further denoted as cell C, cell 202 is indicated as cell A and cell 203 is indicated as cell B. To program a selected cell (e.g., cell A) to a low state (determined by $WL_N$ and $BL_M$), a negative voltage (e.g., −5V) is applied to $WL_N$, whereas a positive voltage (e.g., 5V) is applied to $BL_M$. $BL_{M+1}$ is grounded that induces high electric field (either lateral or vertical field) to program cell A to a low state. As a result, in cell A, electric holes will flow into the trapping layer from the drain side 801 of the cells so as to write data into the trapping layer. However, the program operation of cell A will result in disturbance in adjacent cells (cells B and C) in the virtual ground array. Since cell A is biased (as indicated above), the bias will induce the holes to be injected into the trapping layer of cells B from the source side. Such is undesirable because this will induce a programming error in the cell B. A similar condition occurs at cell C. In cell C, electric holes will be injected into the trapping layer and thus will result in a programming error of cell C.

To prevent program disturbance of the adjacent cells (e.g., cell C) in the adjacent word lines ($WL_{N-1}$ and $WL_{N+1}$), biases (e.g., 0V) are applied to $WL_{N-1}$ and $WL_{N+1}$, which are more positive than $WL_N$. The lesser WL-to-BL bias difference (which induces smaller vertical field) advantageously prevents program disturbance in cell C. Referring to FIGS. 8A, 8B and 8C, after applying the biases in accordance with the invention, the voltages for the gate, source and drain of cells are −5V, 5V, and 2V, respectively. This will suppress the electric holes to be injected into the trapping layer of cell B. Furthermore, as the voltages for the gate, source and drain of cells are 0V, 0V and 5V, respectively, electric holes are suppressed to be injected into the trapping layer of cell C. Disturbance of the adjacent cells is advantageously achieved as a result.

However, in the above described embodiment according to the invention, a number of predetermined voltage values are used as an example, such as 5V, 2V, 0V, etc. While these values are indicative in demonstrating the implementation of the invention, they are not used to confine the scope of the invention and are not limited to only the values described above so long as the biasing effects according to the invention are generally achieved.

To prevent disturbance in cells in $BL_{M-2}$, $BL_{M-3}$, ..., (which also prevents programming disturbance of the adjacent cells (e.g., cell B) in the adjacent bit line $BL_{M-1}$), a positive bias (e.g., 2V) is applied to $BL_{M-1}$. The lesser $BL_M$-to-$BL_{M-1}$ bias difference (which induces smaller lateral field) advantageously prevents program disturbance in cell B where it is beneficially and notably effective for channel length scaling.

Figure 9:
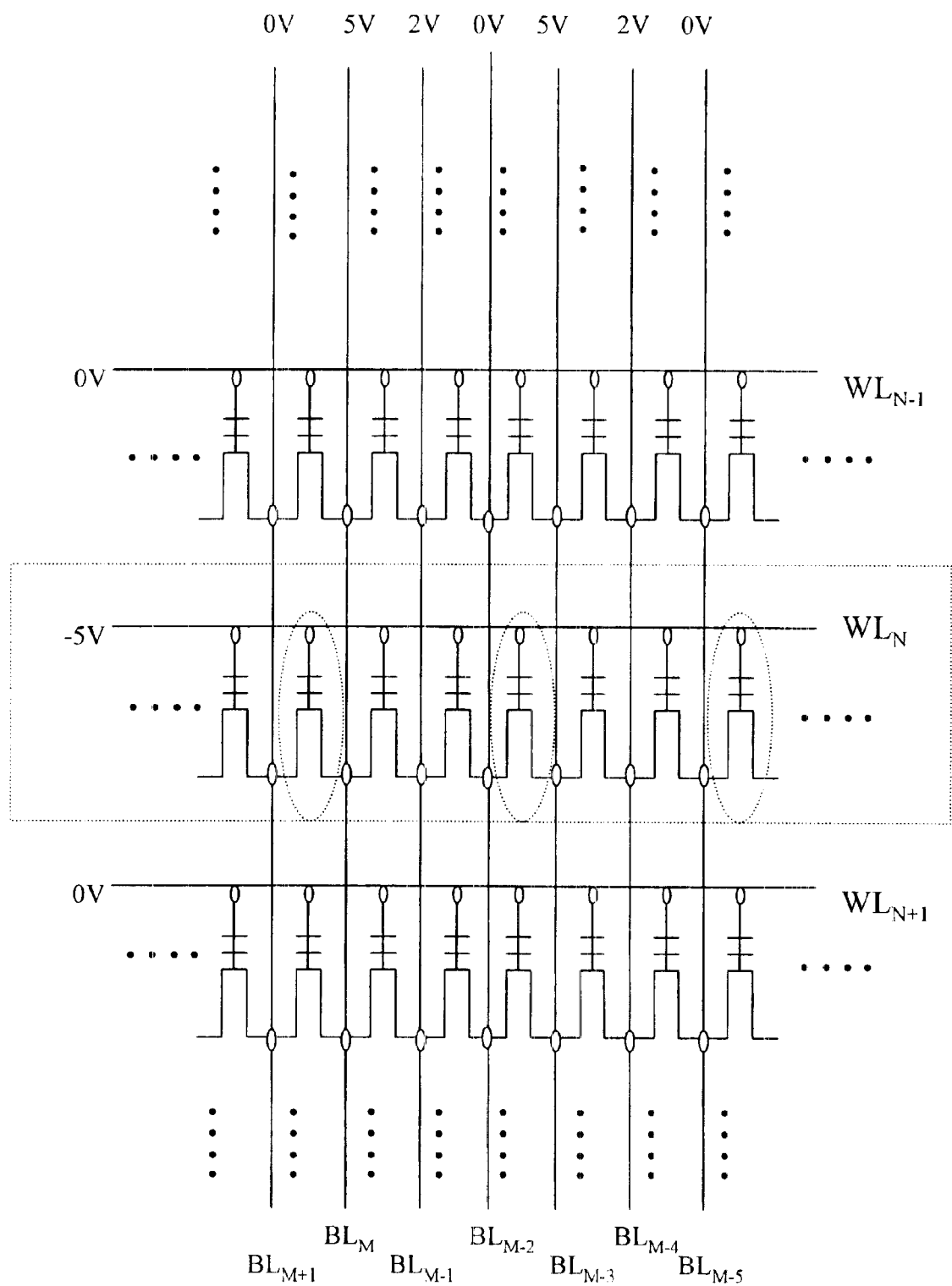
FIG. 9 is a circuit diagram illustrating the internal structure of an array of nonvolatile floating gate memory cell where a plurality of memory cells in a row are programmed at generally the same time in accordance with an additional embodiment of the invention.

For further avoiding the disturbance of $BL_{M-2}$, $BL3_{M-1}$, ..., the cells adjacent nonvolatile memory cell at the interaction of the $BL_{M-1}$ and $WL_N$ are also applied with a positive bias. If a plurality of bits are programmed into the nonvolatile memory cell at generally the same time, the adjacent cells of a row cannot be written at the same time and the cells at the same row to be programmed at the same time must be arranged. FIG. 9 illustrates one embodiment for arranging the cells of the same row to be programmed at the same time in accordance with the invention. This has the maximum density for programming data into the nonvolatile memory cell array at the same time based on the principles of the invention. In FIG. 9, it is illustrated that the voltages applied to the columns are repeated along a sequence of 0V, 5V and 2V. In the drawing, the cells indicated by circles are programmed.

The above discussion is based on the fact that the nonvolatile memory cell is programmed in the trapping layer near the drain side, while the same can be applied to program the source side of the nonvolatile memory cell. In such a scenario, the order of voltages applied to the bitlines is reversed, for example, along an order of 2V, 5V and 0V.

Furthermore, the above-illustrated voltages only serve as examples in describing the principles according to the invention, as other values can be used to substantially achieve similar or generally the same results. In accordance with the invention, the voltages applied to the gate, drain and source in programming a nonvolatile memory cell must conform to the principles discussed above, while the voltage difference between the voltage applied to one terminal (source or drain) of the nonvolatile memory cell to be programmed and the voltage applied to another terminal of another nonvolatile memory cell adjacent thereto must not cause the holes to be injected into the trapping layer of the lateral nonvolatile memory cell. For instance, a voltage difference greater than 1V is sufficient not to cause disturbance to an adjacent nonvolatile memory cell. As a result, in programming (writing) the nonvolatile memory cell, the selection of bit lines at the same time must be prearranged so as to avoid the disturbance.

Figure 10:
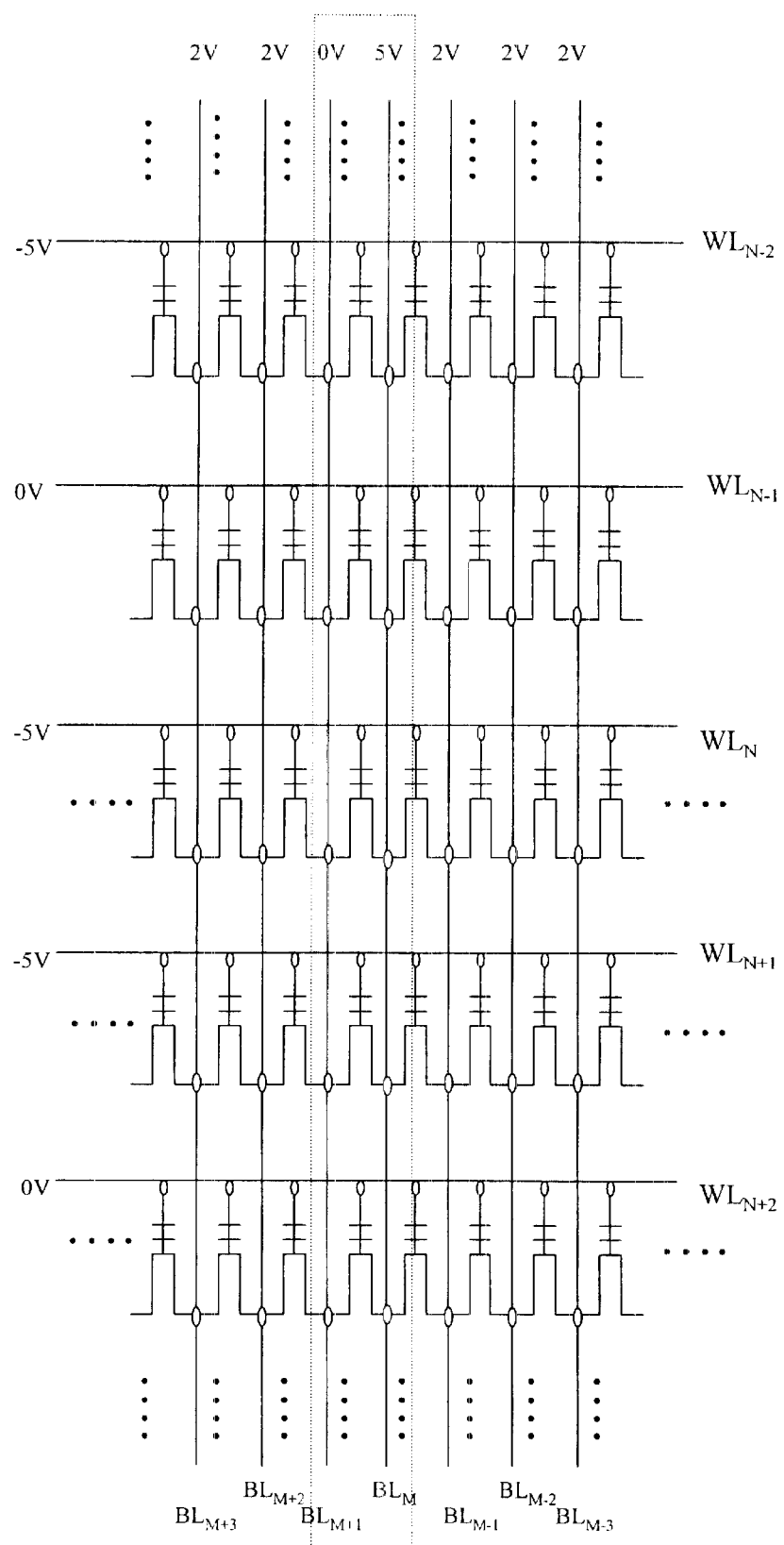
FIG. 10 is a circuit diagram illustrating the internal structure of an array of nonvolatile floating gate memory cell where a plurality of memory cells in a column are programmed at generally the same time in accordance with yet another embodiment of the invention.

FIG. 10 shows one embodiment of programming cells which are located at the same column, wherein a voltage set of 0V, and 5V is applied to the bitline coupled to the drain and source of the cells to be programmed, as indicated by dashed circles and being at the same column. In this case, other bitlines aside the two bitlines coupled to the cells to be programmed are applied with voltages of 2. The wordlines coupled to the cells to be programmed are applied with the voltage of −5V. Other wordlines not coupled to the cells to be programmed are applied with 0V. However, other voltage value not inducing disturbance can be applied.

Although the invention has been described with reference to the preferred embodiments, it will be understood that the invention is not limited to the details described thereof. Substitutions and modifications have been suggested in the foregoing description, and others will occur to those of ordinary skill in the art. In particular, the process steps of the method according to the invention will include methods having substantially the same process steps as the method of the invention to achieve substantially the same result. Therefore, all such substitutions and modifications are intended to be within the scope of the invention as defined in the appended claims and their equivalents.

We claim:

1. A virtual ground nonvolatile memory cell array comprising:
    a plurality of nonvolatile memory cells arranged in rows and columns so as to form said array,
    wherein each of said nonvolatile memory cells further comprises:
        a gate;
        a source;
        a drain;
        a channel region formed between said source and said drain;
        two isolating layers formed on said channel region; and
        a trapping layer formed between said isolating layers, the trapping layer having a sufficiently low conductivity to prevent spreading of charge therein;
        wherein in an erase state, said trapping layer stores electrons.

2. The nonvolatile memory cell array of claim 1, wherein gates of cells of said nonvolatile memory cells in a row are coupled to same row line.

3. The nonvolatile memory cell array of claim 1, wherein said drain of each of said nonvolatile memory cells is connected to said source of an adjacent nonvolatile memory cells.

4. A method of programming at least one nonvolatile memory cell in a virtual ground nonvolatile memory cell array including a plurality of nonvolatile memory cells arranged in rows and columns, wherein the nonvolatile memory cells comprising a trapping layer, the method comprising:
    selecting the at least one nonvolatile memory cell from the plurality of nonvolatile memory cells;
    applying a first potential to a first bitline coupled to one of a source or a drain of said selected nonvolatile memory cells;
    applying a second potential to a second bitline coupled to one of the source or the a drains that is not coupled to the first bitline, of said selected nonvolatile memory cells; and
    applying a third potential to a first wordline coupled to a gate of said selected nonvolatile memory cells; and
    applying a fourth potential to one or more bitlines that are coupled to one or more nonvolatile memory cells that are adjacent to the selected nonvolatile memory cells, wherein the trapping layer having a sufficiently low conductivity to prevent spreading of charge therein, a potential difference between said fourth potential and said first and second potentials is not sufficient to inject a charge into the trapping layers of nonvolatile memory cells adjacent to the selected nonvolatile memory cells.

5. The method of claim 4, wherein
    said first bitline is coupled to said source of the selected nonvolatile memory cells;
    said second bitline is coupled to said drain of the selected nonvolatile memory cells;
    wherein a difference between said first potential and said third potential is sufficient to cause holes to be injected from said source of said selected nonvolatile memory cells to the trapping layer of said selected nonvolatile memory cells so as to cause a bit to be programmed into the trapping layer of the selected memory cells;
    wherein a difference between said second potential and said third potential is not sufficient to cause holes to be injected from said drain of said selected nonvolatile memory cells to the trapping layer of said selected nonvolatile memory cells.

6. The method of claim 4, wherein
    said first bitline is coupled to said source of the selected nonvolatile memory cells;
    said second bitline is coupled to said drain of the selected nonvolatile memory cells;
    a difference between said first potential and said third potential is not sufficient to cause holes to be injected from said source of said selected nonvolatile memory cells to the trapping layer of said selected nonvolatile memory cells;
    wherein a difference between said second potential and said third potential is sufficient to cause holes to be injected from said drain of said selected nonvolatile memory cells to the trapping layer of said selected nonvolatile memory cells so as to cause a bit to be programmed to the trapping layer of the selected nonvolatile memory cells.

7. The method of claim 4, wherein a potential difference between said second and fourth potentials is larger that 1V.

8. The method of claim 4, further comprising:
    applying a fifth potential to one or more wordlines adjacent to the first wordline.

9. The method of claim 8, wherein a potential difference between said third and fifth potentials is larger than about one volt.

* * * * *